United States Patent
Tabata et al.

(10) Patent No.: US 9,634,655 B2
(45) Date of Patent: Apr. 25, 2017

(54) DRIVE DEVICE HAVING FIRST AND SECOND SWITCHING DEVICES WITH DIFFERENT GATE WIDTHS

(71) Applicant: Panasonic Corporation, Osaka (JP)

(72) Inventors: Osamu Tabata, Osaka (JP); Shuichi Nagai, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/011,703

(22) Filed: Feb. 1, 2016

(65) Prior Publication Data
US 2016/0248413 A1 Aug. 25, 2016

(30) Foreign Application Priority Data
Feb. 24, 2015 (JP) .................................. 2015-033531

(51) Int. Cl.
H03K 3/00 (2006.01)
H03K 17/041 (2006.01)
H03K 17/687 (2006.01)

(52) U.S. Cl.
CPC ... H03K 17/04106 (2013.01); H03K 17/6871 (2013.01)

(58) Field of Classification Search
CPC .................. H03K 17/04106; H03K 17/6871
See application file for complete search history.

(56) References Cited

U.S. PATENT DOCUMENTS

| | | | | |
|---|---|---|---|---|
| 6,052,025 A * | 4/2000 | Chang | ................. | H03F 3/45219 330/253 |
| 6,836,173 B1 * | 12/2004 | Yang | .................... | H03K 17/063 326/88 |
| 6,940,262 B2 * | 9/2005 | Dequina | ................. | H02M 1/38 323/284 |
| 7,126,388 B2 * | 10/2006 | Harriman | .............. | H02M 7/538 327/108 |
| 8,018,255 B2 * | 9/2011 | Hirao | .................... | H02M 3/158 257/288 |
| 2014/0049297 A1 | 2/2014 | Nagai et al. | | |

FOREIGN PATENT DOCUMENTS

WO  2013/065254  5/2013

\* cited by examiner

*Primary Examiner* — Kenneth B Wells
(74) *Attorney, Agent, or Firm* — McDermott Will & Emery LLP

(57) ABSTRACT

A drive device that drives a semiconductor switching device includes a capacitor and an output selection unit that selects whether or not to supply charge of the capacitor to a conduction control terminal of the semiconductor switching device, in which the output selection unit includes a first switching device and a second switching device, the charge of the capacitor is supplied to the conduction control terminal of the semiconductor switching device by the first switching device going to a conducting state, the charge is extracted from the conduction control terminal of the semiconductor switching device by the second switching device going to the conducting state, and a gate width of the second switching device is smaller than the gate width of the first switching device.

11 Claims, 14 Drawing Sheets

DRIVE DEVICE HAVING FIRST AND SECOND SWITCHING DEVICES WITH DIFFERENT GATE WIDTHS

BACKGROUND

1. Technical Field

The present disclosure relates to driving of a semiconductor switching device.

2. Description of the Related Art

International Publication No. 2013/065254, for example, discloses a drive device that drives a semiconductor switching device.

SUMMARY

The related art has difficulty in increasing a speed of driving of a semiconductor switching device.

In one general aspect, the techniques disclosed here feature a drive device that drives a semiconductor switching device, the drive device including: a capacitor; and an output selection unit that selects whether or not to supply charge of the capacitor to a conduction control terminal of the semiconductor switching device, in which the output selection unit includes a first switching device and a second switching device, a first terminal of the capacitor and a first terminal of the first switching device are connected with each other, a second terminal of the capacitor and a terminal of the semiconductor switching device are connected with each other at a first contact point, a second terminal of the first switching device and the conduction control terminal of the semiconductor switching device are connected with each other at a second contact point, a first terminal of the second switching device and the second contact point are connected with each other, a second terminal of the second switching device and the first contact point are connected with each other, the charge of the capacitor is supplied to the conduction control terminal of the semiconductor switching device by the first switching device going to a conducting state, the charge is extracted from the conduction control terminal of the semiconductor switching device by the second switching device going to the conducting state, and a gate width of the second switching device is smaller than the gate width of the first switching device.

According to the present disclosure, a speed of driving of a semiconductor switching device can be increased.

Additional benefits and advantages of the disclosed embodiments will be apparent from the specification and drawings. The benefits and/or advantages may be individually provided by the various embodiments and features of the specification and drawings, and need not all be provided in order to obtain one or more of the same.

DETAILED DESCRIPTION

Embodiments will be described below in detail with reference to the drawings.

(First Embodiment)

Figure 1:
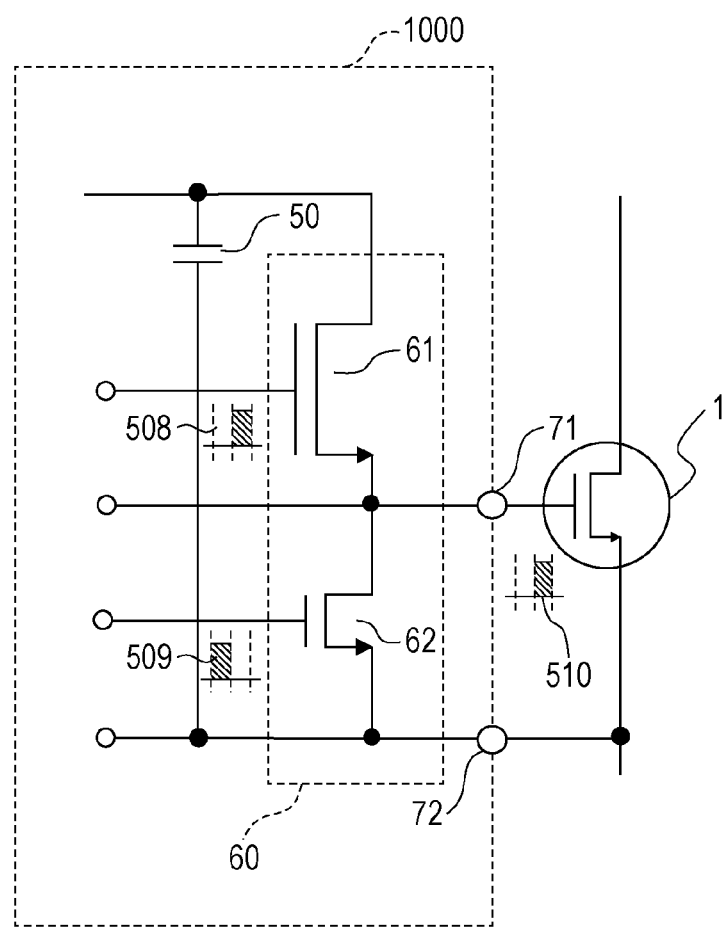
FIG. 1 is a diagram illustrating a schematic configuration of a drive device according to a first embodiment.

FIG. 1 is a diagram illustrating a schematic configuration of a drive device 1000 according to a first embodiment.

The drive device 1000 according to the first embodiment is a drive device that drives a semiconductor switching device 1 (for example, power device or the like).

The drive device 1000 according to the first embodiment includes a capacitor 50 and an output selection unit 60.

The output selection unit 60 selects whether or not to supply charge from the capacitor 50 to a conduction control terminal (for example, gate terminal) of the semiconductor switching device 1.

The output selection unit 60 includes a first switching device (for example, transistor 61) and a second switching device (for example, transistor 62).

A first terminal of the capacitor 50 and a first terminal (for example, drain terminal) of the first switching device are connected with each other.

A second terminal of the capacitor 50 and a terminal (for example, source terminal) of the semiconductor switching device 1 are connected with each other at a first contact point.

A second terminal (for example, source terminal) of the first switching device and the conduction control terminal of the semiconductor switching device 1 are connected with each other at a second contact point.

A first terminal (for example, drain terminal) of the second switching device connects to the second contact point.

A second terminal (for example, source terminal) of the second switching device connects to the first contact point.

The charge of the capacitor 50 is supplied to the conduction control terminal of the semiconductor switching device 1 by the first switching device going to a conducting state.

The charge is extracted from the conduction control terminal of the semiconductor switching device 1 by the second switching device going to the conducting state.

Figure 2:
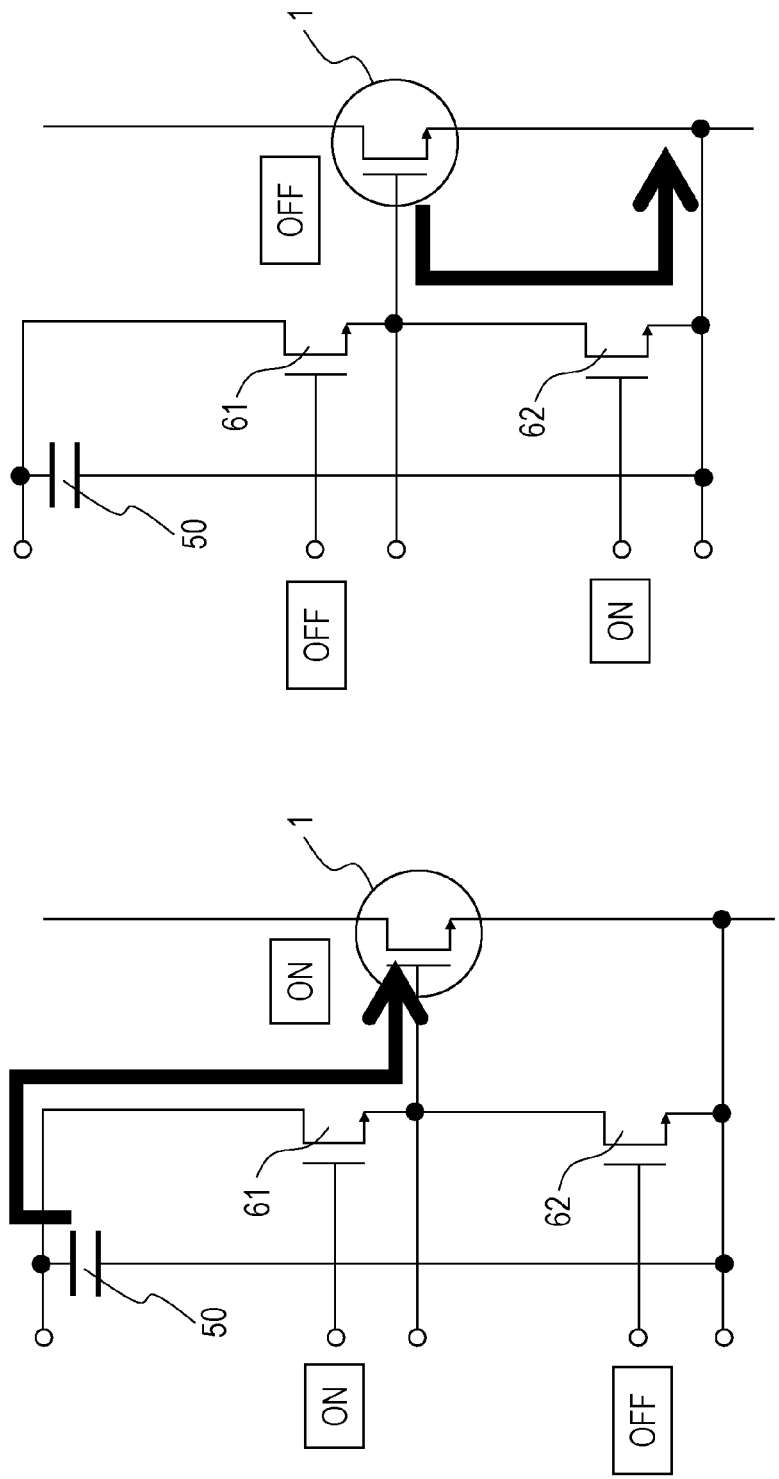
FIGS. 2A and 2B are diagrams for describing an operation example of an output selection unit.

FIGS. 2A and 2B are diagrams for describing an operation example of the output selection unit 60.

Figure 3:
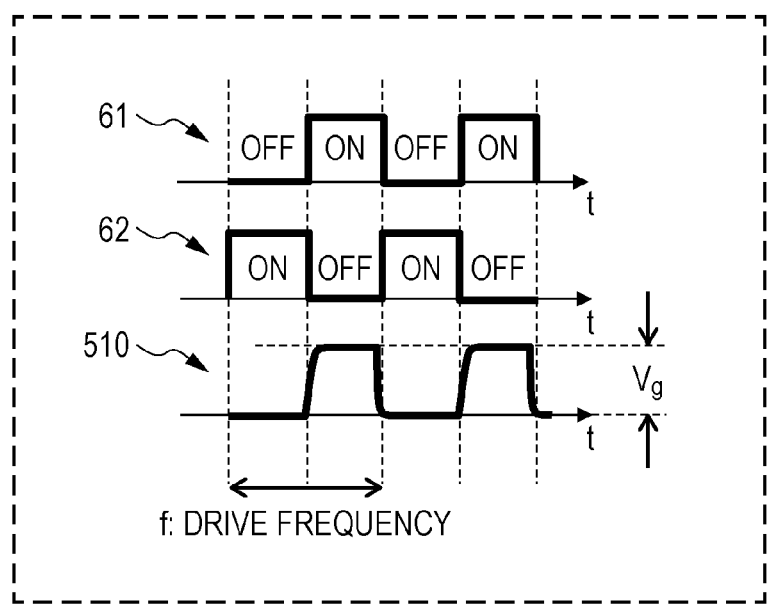
FIG. 3 is a diagram illustrating the relationship between a voltage across the gate/source and a voltage of a conduction control terminal of a semiconductor switching device.

FIG. 3 is a diagram illustrating the relationship between a voltage across the gate/source of the transistor 61 and the transistor 62 and a voltage of the conduction control terminal of the semiconductor switching device 1.

Note that the voltage across the gate/source is the voltage of the gate terminal in a case where the source terminal of the transistor is set as a reference.

As illustrated in FIG. 3, the output selection unit 60 repeatedly alternates between a state where the transistor 61 is on (conducting state) and the transistor 62 is off (non-conducting state) and a state where the transistor 61 is off and the transistor 62 is on, in accordance with first signals and second signals, which are control signals that are input.

Thus, the output selection unit 60 performs switching of the semiconductor switching device 1.

That is to say, the output selection unit 60 supplies charge (that is, driving electric power 510) charged at the capacitor 50 to the semiconductor switching device 1, in accordance with input signals. That is to say, the semiconductor switching device 1 is switched on (conducting state).

FIG. 2B illustrates the state where the transistor 61 is off and the transistor 62 is on.

That is to say, FIG. 2B is a state where an off voltage is applied between the gate and source of the transistor 61 and an on voltage is applied between the gate and source of the transistor 62.

In the state in FIG. 2B, the capacitor 50 is charged with charge, but the transistor 61 is in the off state, and therefore current is not supplied to the semiconductor switching device 1. That is to say, the semiconductor switching device 1 is in an off (non-conducting) state.

On the other hand, FIG. 2A illustrates the state where the transistor 61 is on and the transistor 62 is off.

That is to say, FIG. 2A is a state where the on voltage is applied between the gate and source of the transistor 61 and the off voltage is applied between the gate and source of the transistor 62.

In the state in FIG. 2A, the charge which is charged to the capacitor 50 in the state in FIG. 2B is supplied to the gate terminal of the semiconductor switching device 1.

In a case where the state in FIG. 2A is switched to the state where the transistor 61 is off and the transistor 62 is on, the charge stored in the capacitor 50 increases again, as illustrated in FIG. 2B. The charge stored at the gate terminal of the semiconductor switching device 1 is discharged to an output reference terminal 72 by the transistor 62.

The above operations enable the drive device 1000 according to the first embodiment to instantaneously supply large current to the semiconductor switching device 1.

In the drive device 1000 according to the first embodiment, the gate width of the second switching device is smaller than the gate width of the first switching device.

According to the above configuration, the speed of driving of the semiconductor switching device can be increased.

This effect will be described in detail below.

Figure 4:
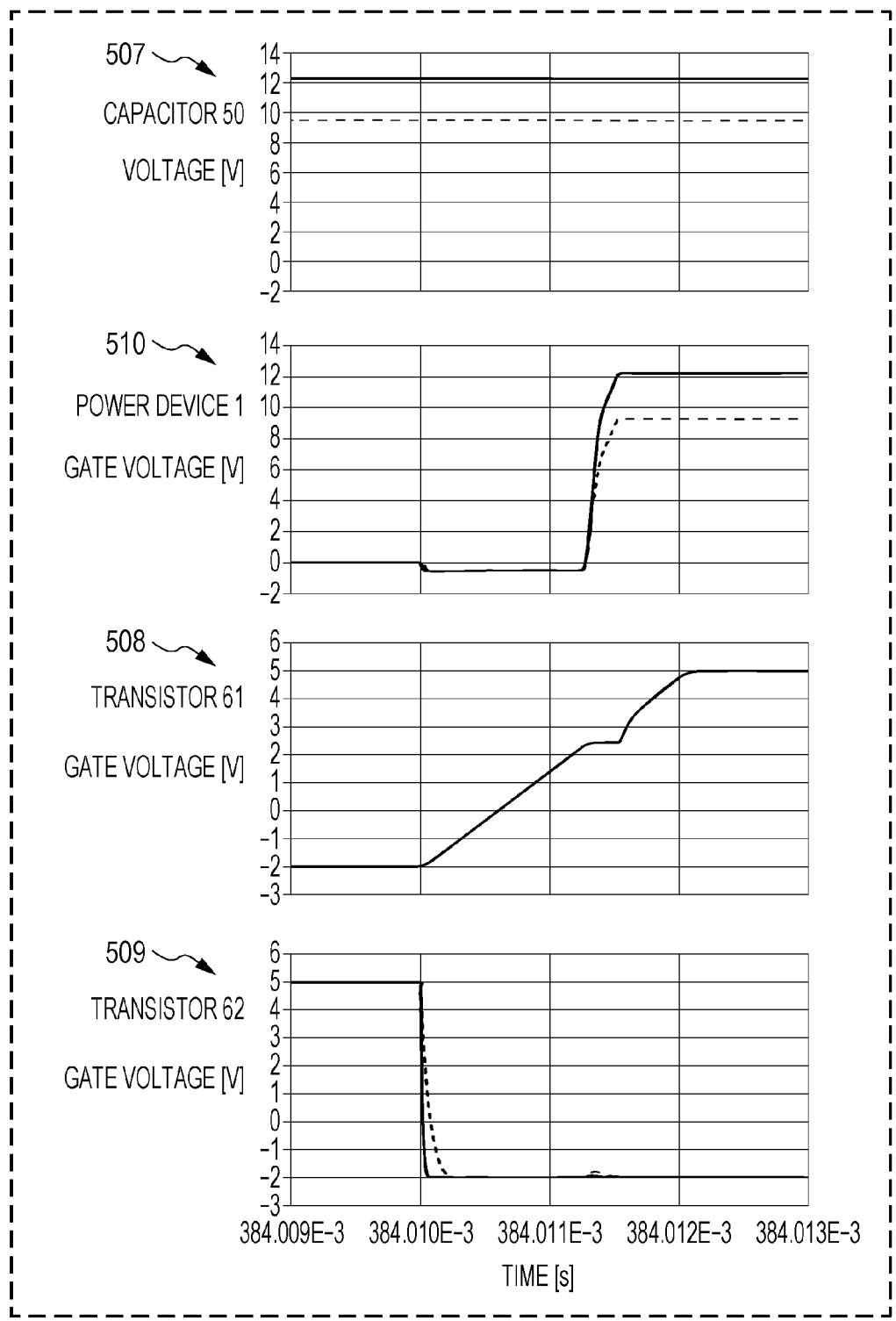
FIG. 4 is a diagram illustrating simulation results of driving of the drive device.
Figure 5:
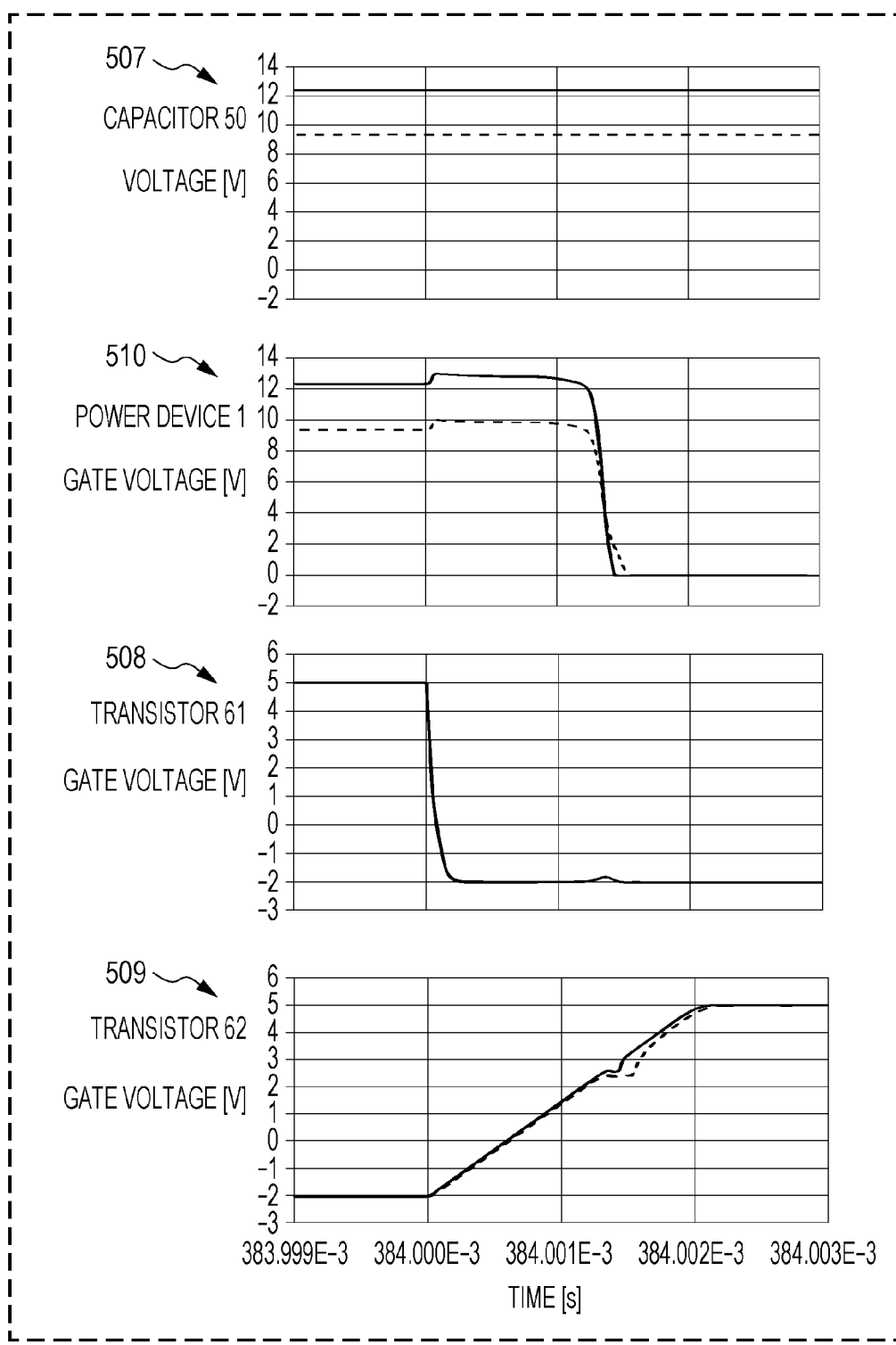
FIG. 5 is a diagram illustrating simulation results of driving of the drive device.

FIGS. 4 and 5 are diagrams illustrating simulation results of driving of the drive device 1000.

In FIGS. 4 and 5, the broken lines represent results in a case where the gate width of the second switching device (transistor 62) is the same as the gate width of the first switching device (transistor 61) (that is, comparative examples). Meanwhile, in FIGS. 4 and 5, the solid lines represent results in a case where the gate width of the second switching device (transistor 62) is smaller than the gate width of the first switching device (transistor 61) (that is, the configuration of the first embodiment).

First, the configuration of the first embodiment enables a drain-source capacitance $C_{ds}$ of the second switching device to be reduced. Accordingly, the consumption of the charge stored in the capacitor by the second switching device can be reduced. As illustrated in FIG. 4, this enables the voltage of the capacitor to be kept high. As a result, as illustrated in FIG. 4, a rising speed of the gate voltage in the semiconductor switching device can further be increased.

Further, the configuration of the first embodiment enables a gate-source capacitance $C_{gs}$ of the second switching device to be reduced. Accordingly, as illustrated in FIG. 5, a rise of the second switching device can be made faster. As a result, as illustrated in FIG. 5, a falling speed of the gate voltage in the semiconductor switching device can further be increased.

Figure 6:
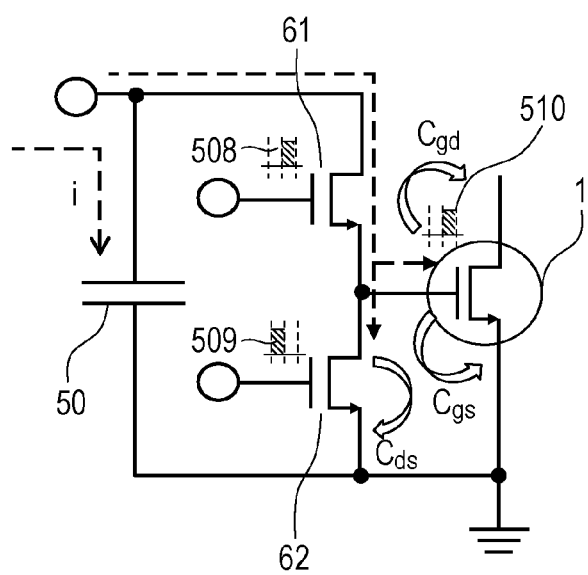
FIG. 6 is a diagram schematically illustrating a consumption state of charge stored in a capacitor.

FIG. 6 is a diagram schematically illustrating a consumption state of charge stored in the capacitor 50 in driving of the drive device 1000.

In an example of FIG. 6, it is assumed that the capacitor 50 is constantly charged by charge current i.

In a process of raising the gate of the semiconductor switching device 1, the charge stored in the capacitor 50 is consumed (discharged) in order to charge the gate-source capacitance $C_{gs}$ of the semiconductor switching device 1, a gate-drain capacitance $C_{gd}$, and a drain-source capacitance $C_{ds62}$ of the transistor 62.

In such a charge-discharge relationship of the capacitor 50, as illustrated in FIG. 3, the following expression (1) has to be satisfied in order to keep the gate voltage of the semiconductor switching device 1 to a predetermined voltage value $V_g$ at a drive frequency f.

$$i = (C_{ds62} + C_{gs} + C_{gd}) \cdot V_g \cdot f + i_{leak} + i_g \quad \text{(Expression 1)}$$

Here, $i_{leak}$ represents off-leakage current of the transistor 61 and the transistor 62. $i_g$ represents gate current needed to make the semiconductor switching device 1 conducting.

Now, the following expression (2) is derived from the above expression (1).

$$C_{ds62} = (i - i_{leak} - i_g)/(V_g \cdot f) - (C_{gs} + C_{gd}) \quad \text{(Expression 2)}$$

Here, the following expression (3), that is, the expression (4) has to be satisfied in order to keep the gate voltage of the semiconductor switching device 1 to the predetermined voltage value $V_g$ or larger at a drive frequency f.

$$T_{rw62} \cdot C_{dsw} \cdot C_{ds62} \quad \text{(Expression 3)}$$

$$T_{rw62} \cdot C_{ds62}/C_{dsw} \quad \text{(Expression 4)}$$

Here, $T_{rw62}$ represents the size of the transistor 62 which is specified by the gate width. Further, $C_{dsw}$ is the drain-source capacitance per unit gate width of the transistor 62 (or transistor 61).

The transistor 61 has to have rush current $i_{rush61}$ expressed by the following expression (5) flowing therethrough.

$$i_{rush61} = (C_{ds62} + C_{gs} + C_{gd}) \cdot V_g/t \quad \text{(Expression 5)}$$

Here, t represents a target rising time (time constant) of the gate voltage of the semiconductor switching device 1.

The transistor 61 has to have the size that allows current of the rush current $i_{rush61}$ or larger to flow therethrough. That is to say, the following expression (6), that is, the expression (7) has to be satisfied.

$$T_{rw61} \cdot i_{rushw} \cdot i_{rush61} \quad \text{(Expression 6)}$$

$$T_{rw61} \cdot i_{rush61}/i_{rushw} \quad \text{(Expression 7)}$$

Here, $T_{rw61}$ represents the size of the transistor 61 which is specified by the gate width. Further, $i_{rushw}$ represents the rush current that can flow per unit gate width of the transistor 61 (or transistor 62).

In the first embodiment, the sizes of the transistor 61 and the transistor 62 are set within the range specified by the above expression (4) and expression (7). Accordingly, the charge stored in the capacitor 50 can effectively be consumed for gate driving of the semiconductor switching device 1. This enables the voltage level of the capacitor 50 to be kept high. Consequently, the gate voltage $V_g$ of the semiconductor switching device 1 can be generated.

In the drive device 1000 according to the first embodiment, the first switching device and the second switching device may be normally-on transistors.

Figure 7A:
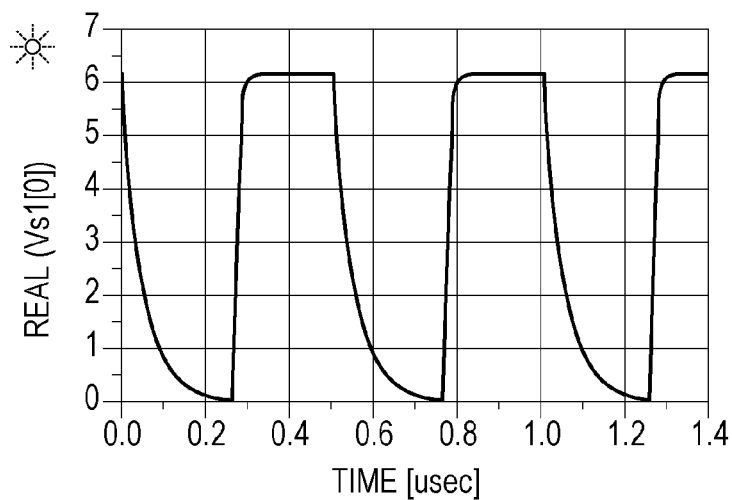
FIGS. 7A and 7B are diagrams illustrating an example of a voltage waveform in a case of using normally-off transistors.
Figure 7B:
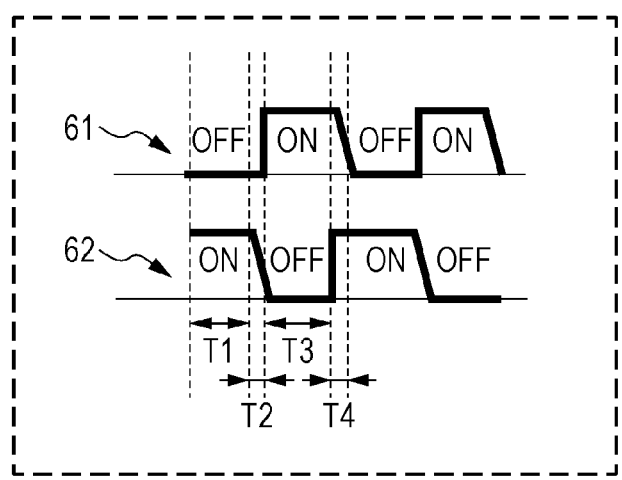

FIGS. 7A and 7B are diagrams illustrating an example of a voltage waveform in a case of using normally-off transistors as a comparative example.

Figure 8:
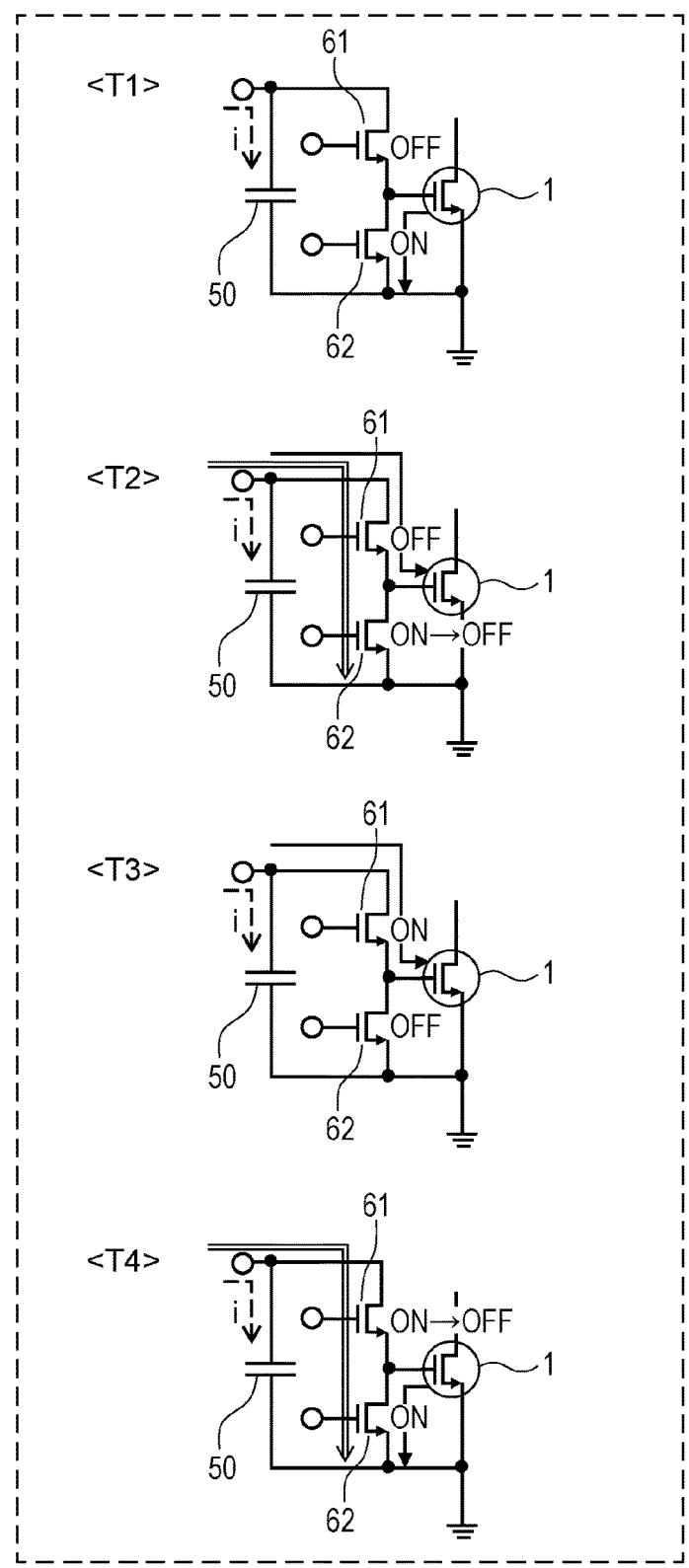
FIG. 8 is a diagram illustrating current flows in periods in FIG. 7B.

FIG. 8 is a diagram illustrating current flows in periods T1 to T4 in FIG. 7B.

As illustrated in FIG. 7A, the transistor rises fast in a case of using a normally-off transistor. On the other hand, the transistor falls slowly because the time constant of extraction of the gate charge of the transistor is small. Thus, as illustrated in FIG. 7B, the period T2 and the period T4 occur, which are periods in which both of the transistor 61 and the transistor 62 are in the conducting state. As a result, the transistor 61 and the transistor 62 are at the same time in the conducting state, thus facilitating flow of through-current.

Figure 9A:
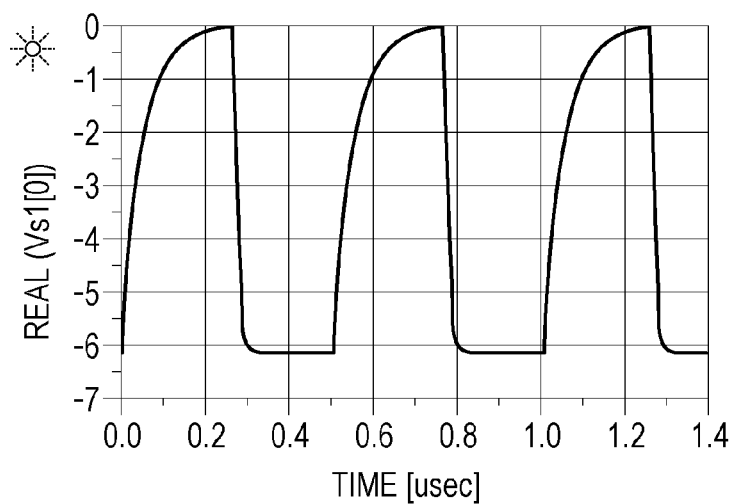
FIGS. 9A and 9B are diagrams illustrating an example of the voltage waveform in a case of using normally-on transistors.
Figure 9B:
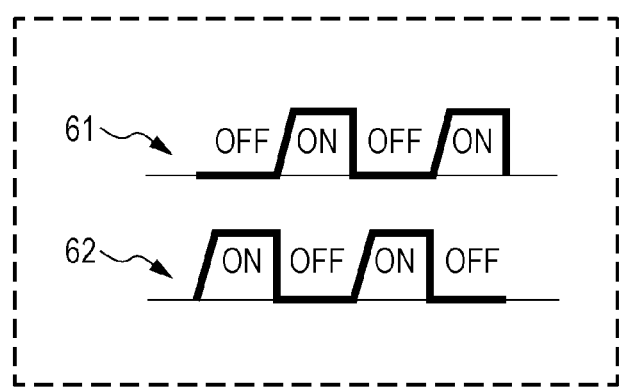

FIGS. 9A and 9B are diagrams illustrating an example of the voltage waveform in a case of using the normally-on transistors.

As illustrated in FIG. 9A, a configuration that uses the normally-on transistors enables the falls of the first switching device and the second switching device to be fast. In addition, this configuration enables the rises of the first switching device and the second switching device to be slow. Thus, as illustrated in FIG. 9B, the periods in which both of the transistor 61 and the transistor 62 are in the conducting state can be reduced as compared to the example illustrated in FIGS. 7A and 7B. That is to say, a period in which the first switching device and the second switching device are simultaneously in the conducting state can be suppressed. Accordingly, occurrence of the through-current can be suppressed, which is current that flows toward a ground through the first switching device and the second switching device. This enables unnecessary consumption of the charge stored in the capacitor as the through-current to be reduced. Accordingly, lowering of the voltage level of the capacitor can be suppressed. As a result, a high level of the gate voltage to the semiconductor switching device can be maintained.

(Second Embodiment)

A second embodiment will be described below. Repeated descriptions of elements of the above first embodiment will appropriately be omitted.

Figure 10:
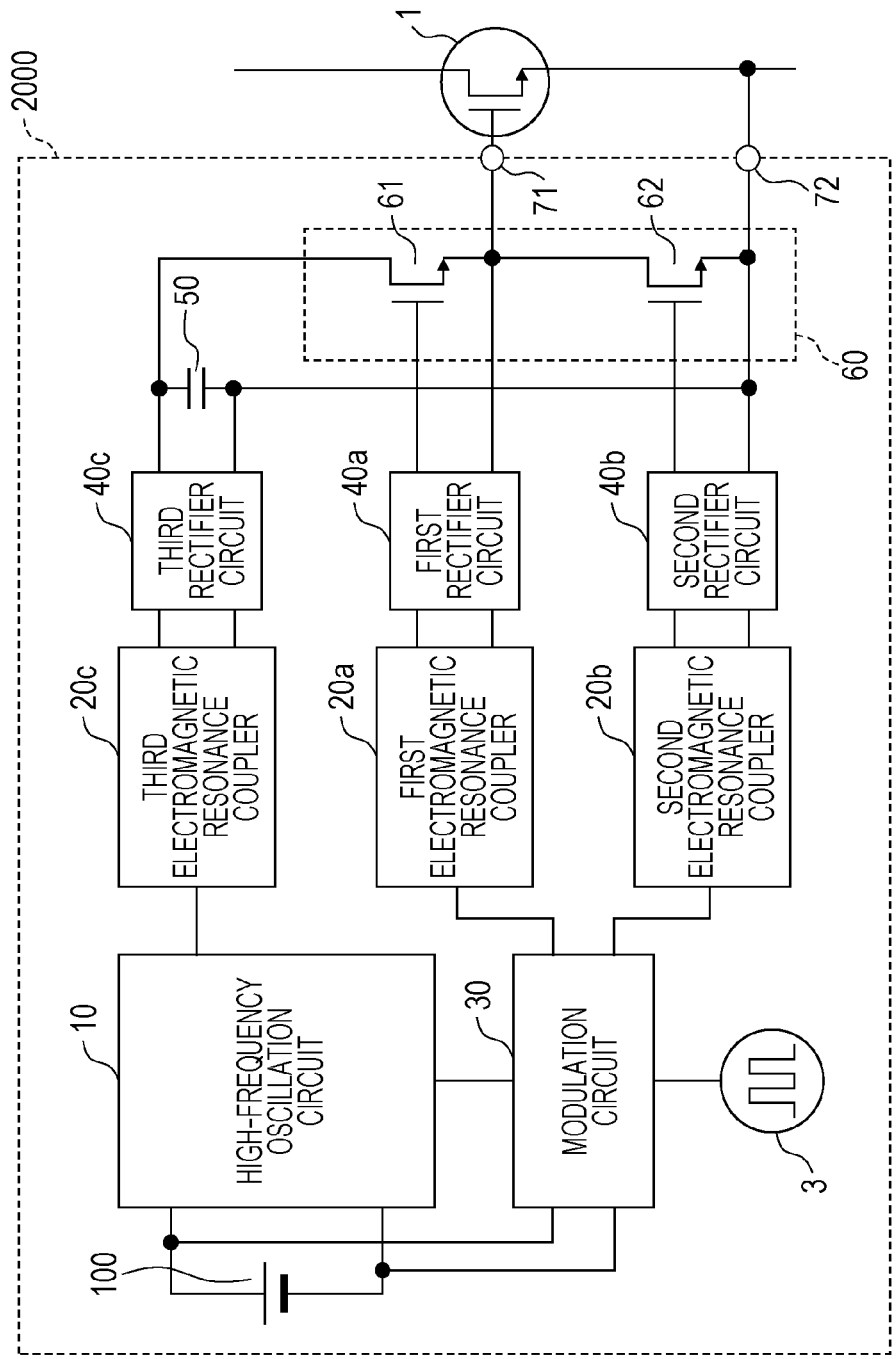
FIG. 10 is a diagram illustrating a schematic configuration of a drive device according to a second embodiment.

FIG. 10 is a diagram illustrating a schematic configuration of a drive device 2000 according to the second embodiment.

The drive device 2000 according to the second embodiment includes the configuration of the drive device 1000 according to the first embodiment.

The drive device 2000 according to the second embodiment further includes a first electromagnetic resonance coupler 20a, a second electromagnetic resonance coupler 20b, a first rectifier circuit 40a, and a second rectifier circuit 40b.

First modulated signals obtained by a modulation of a high-frequency wave in accordance with input signals are transmitted by isolated transmission by the first electromagnetic resonance coupler 20a and rectified by the first rectifier circuit 40a. Accordingly, first control signals are generated.

The first control signals are input to the conduction control terminal of the first switching device. Accordingly, the conducting state of the first switching device is controlled.

Second modulated signals obtained by a modulation of the high-frequency wave in accordance with the input signals are transmitted by isolated transmission by the second electromagnetic resonance coupler 20b and rectified by the second rectifier circuit 40b. Accordingly, second control signals are generated.

The second control signals are input to the conduction control terminal of the second switching device. Accordingly, the conducting state of the second switching device is controlled.

This configuration enables large current to be supplied to the semiconductor switching device while isolation by the electromagnetic resonance coupler is realized.

As illustrated in FIG. 10, the drive device 2000 according to the second embodiment may further include a third electromagnetic resonance coupler 20c and a third rectifier circuit 40c.

In the configuration illustrated in FIG. 10, the high-frequency wave is transmitted by isolated transmission by the third electromagnetic resonance coupler 20c and rectified by the third rectifier circuit 40c. Accordingly, a charging voltage is generated.

In this case, the capacitor 50 may be charged by this charging voltage.

This configuration enables a constant charging voltage to be supplied to the capacitor, for example, by rectifying high-frequency waves to yield the charging voltage. Further, for example, the high-frequency waves used for controlling the output selection unit may also be used to generate the charging voltage.

Figure 11:
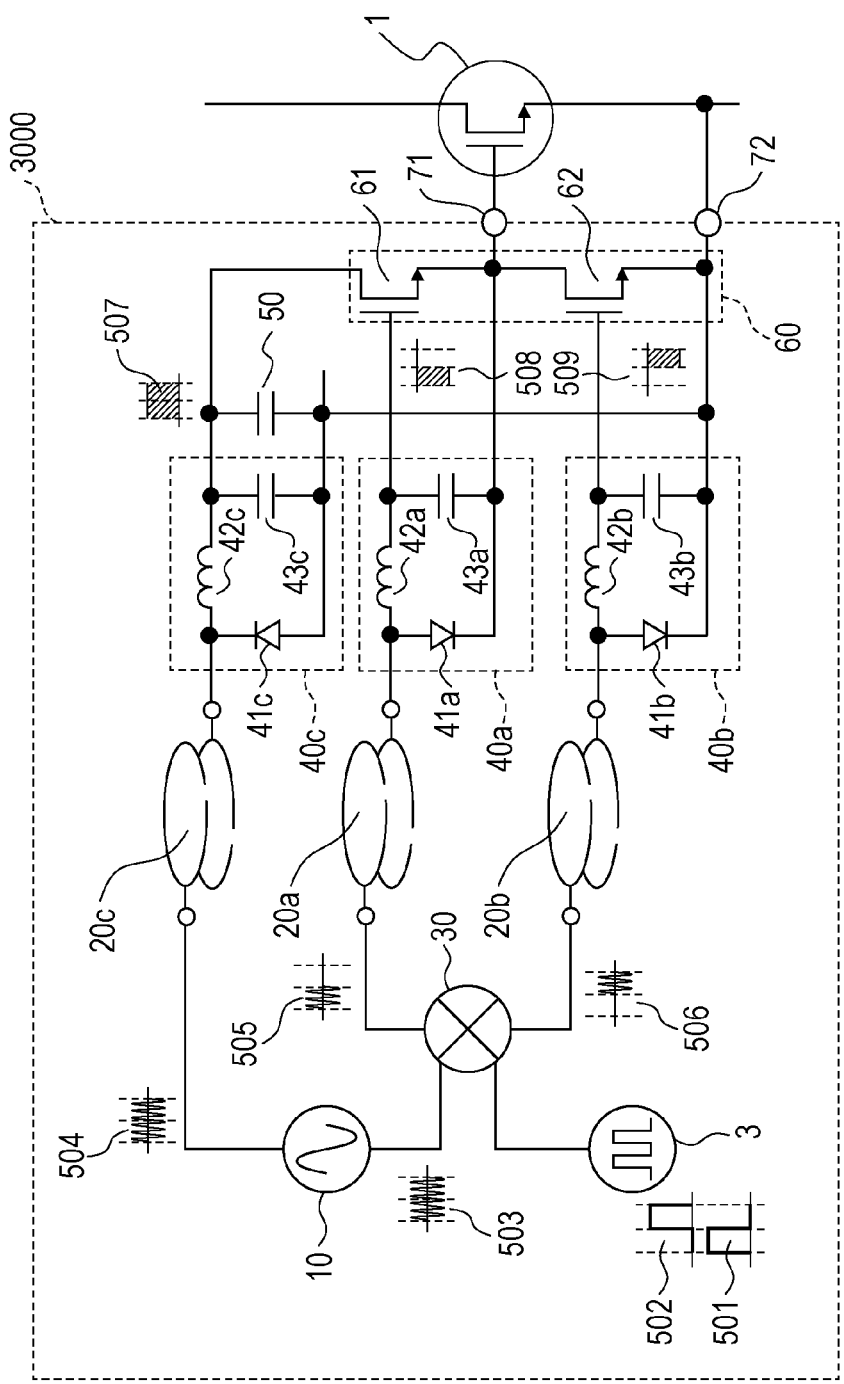
FIG. 11 is a circuit diagram illustrating a drive device as a specific configuration example of the drive device according to the second embodiment.

FIG. 11 is a circuit diagram illustrating a drive device 3000 as a specific configuration example of the drive device 2000.

The drive device 3000 includes a DC power source 100 and a signal generator 3. The drive device 3000 also includes a high-frequency oscillation circuit 10, a modulation circuit 30, the first electromagnetic resonance coupler 20a, the second electromagnetic resonance coupler 20b, and the third electromagnetic resonance coupler 20c. The drive device 3000 also includes the first rectifier circuit 40a, the second rectifier circuit 40b, the third rectifier circuit 40c, the capacitor 50, the output selection unit 60, an output terminal 71, and an output reference terminal 72.

Note that the capacitor 50 is a capacitive device, for example, and is not parasitic capacitance. The capacitor 50 is a device having capacitance of 10 pF or larger, for example.

Note that the output selection unit 60 is configured including the first switching device and the second switching device, for example, in the first embodiment. The first switching device may be the transistor 61, for example. The second switching device may be the transistor 62, for example.

The DC power source 100 is a power source which supplies power so that the high-frequency oscillation circuit 10 and modulation circuit 30 can operate, for example. While FIG. 10 illustrates the DC power source 100 as being provided within the drive device 2000, this may be provided externally from the drive device 2000. That is to say, the drive device 2000 does not have to include the DC power source 100.

The signal generator 3 generates input signals and outputs the input signals to the modulation circuit 30. The input signals are equivalent to control signals, and driving signals to drive the semiconductor switching device 1 are generated based on the control signals. The signal generator 3 is made up of a logic IC, for example. The input signals are binary signals of high level and low level, as represented by a waveform 501 and a waveform 502 in FIG. 11.

The input signals may be made up of first input signals and second input signals. In the example illustrated in FIG. 11, the waveform 501 is the first input signals, and the waveform 502 is the second input signals. The first input signals include a first low-level voltage and a first high-level voltage larger than the first low-level voltage, for example. The second input signals include a second low-level voltage and a second high-level voltage larger than the second low-level voltage, for example. The second input signals may exhibit the second low-level voltage in a period in which the first input signals exhibit the first high-level voltage. The first input signals may exhibit the first low-level voltage in a period in which the second input signals exhibit the second high-level voltage. The second input signals may be signals obtained by inverting the first input signals. For example, the second input signals may be signals obtained by inverting the first input signals at an intermediate value between the first high-level voltage and the second high-level voltage as a reference. In this case, the first input signals and the second input signals may be in a complementary relationship, as illustrated in FIG. 11. The first low-level voltage and/or second low-level voltage may be 0 V, for example.

While FIG. 11 illustrates the signal generator 3 as being provided within the drive device 3000, this may be provided externally from the drive device 3000. In this case, the drive device 3000 includes a first input terminal to which input signals are input. That is to say, the drive device 3000 does not have to include the signal generator 3.

The high-frequency oscillation circuit 10 generates high-frequency waves. The high-frequency waves may be microwave power. The high-frequency waves serve to transmit electric power. The high-frequency oscillation circuit 10 includes at least two output systems. The high-frequency oscillation circuit 10 outputs the generated high-frequency waves to the modulation circuit 30 and the third electromagnetic resonance coupler 20c. The high-frequency waves have waveforms such as those of a waveform 503 and a waveform 504 illustrated in FIG. 11, for example. The frequency of the high-frequency waves may be 2.4 GHz or 5.8 GHz which is an ISM band available for unlicensed use if output is low, or may be other frequencies. The high-frequency oscillation circuit 10 specifically may be a Colpitts oscillator, a Hartley oscillator, or some other oscillator which generates microwaves. The high-frequency oscillation circuit 10 may include a frequency adjusting mechanism for cases where the frequency of high-frequency waves fluctuates. Note that the high-frequency waves generated by the high-frequency oscillation circuit 10 have a certain amplitude and a certain frequency, for example.

In the present disclosure, the high-frequency waves modulated by the first input signals and/or the second input signals, that is to say, high-frequency waves which are carrier waves for the first input signals and/or the second input signals, may be referred to as first high-frequency waves, and high-frequency waves for supplying electric power for charging may be referred to as second high-frequency waves. In the example illustrated in FIG. 11, the waveform 503 represents the first high-frequency waves, and the waveform 504 represents the second high-frequency waves. Note that the second high-frequency waves are input to the third electromagnetic resonance coupler in the first embodiment. In this case, the second high-frequency waves may have a certain amplitude or may have multiple amplitudes. That is to say, the second high-frequency waves may have signal components based on multiple different amplitudes. The first high-frequency waves and the second high-frequency waves may have the same amplitude, or may have different amplitudes. It should be noted, however, in a case where the second high-frequency waves have a larger amplitude than the first high-frequency waves, the charge amount which is charged to the capacitor can be increased, which will be described later. The first high-frequency waves and the second high-frequency waves may have the same frequency or may have different frequencies.

While FIG. 11 illustrates the high-frequency oscillation circuit 10 as being provided within the drive device 3000, this may be provided externally from the drive device 3000. In this case, the drive device 3000 includes a second input terminal to which the high-frequency waves are input. That is to say, the drive device 3000 may include the high-frequency oscillation circuit 10. The high-frequency oscillation circuit 10 may be included in a high-frequency wave generator, as described later.

The modulation circuit 30 generates the first modulated signals by modulating the high-frequency waves in accordance with the first input signals output from the signal generator 3 and outputs the first modulated signals to the first electromagnetic resonance coupler 20a. In a case where the modulation circuit 30 is a frequency mixer such as illustrated in FIG. 11, the modulation circuit 30 mixes the first input signals and the high-frequency waves to generate the first modulated signals. The first modulated signals have a waveform such as represented by a waveform 505 in FIG. 11, for example.

Further, the modulation circuit 30 generates second modulated signals by modulating the high-frequency waves in accordance with the second input signals output from the signal generator 3 which are different from the first input signals and outputs the second modulated signals to the second electromagnetic resonance coupler 20b. Specifically, in a case where the modulation circuit 30 is a frequency mixer such as illustrated in FIG. 11, the modulation circuit 30 mixes the second input signals and the high-frequency waves to generate the second modulated signals. The second modulated signals have a waveform such as represented by a waveform 506 in FIG. 11, for example. In a case where the second input signals are signals obtained by inverting the first input signals, the first modulated signals and the second modulated signals are in a complementary relationship.

The first modulated signals include a first amplitude and a second amplitude which is larger than the first amplitude, for example. The first amplitude of the first modulated signals corresponds to the first low-level voltage of the first input signals, for example, and the second amplitude of the first modulated signals corresponds to the first high-level voltage of the first input signals, for example. The second modulated signals include a third amplitude and a fourth amplitude which is larger than the third amplitude, for example. The third amplitude of the second modulated signals corresponds to the second low-level voltage of the second input signals, for example, and the fourth amplitude of the second modulated signals corresponds to the second high-level voltage of the second input signals, for example. The second modulated signals may exhibit the third amplitude in a period in which the first modulated signals exhibit the second amplitude. The first modulated signals may exhibit the first amplitude in a period in which the second modulated signals exhibit the fourth amplitude. The first amplitude and third amplitude, and/or the second amplitude and fourth amplitude, may be the same value. The first amplitude and/or the third amplitude may be zero.

While the first modulated signals and the second modulated signals have been described as being in a complementary relationship in the example illustrated in FIG. 11, the input signals may be other waveforms which are more optimal.

In the example illustrated in FIG. 11, the modulation circuit 30 is a frequency mixer, and more specifically is a so-called differential mixer.

The first electromagnetic resonance coupler 20a performs isolated transmission of the first modulated signals generated by the modulation circuit 30.

The second electromagnetic resonance coupler 20b performs isolated transmission of the second modulated signals generated by the modulation circuit 30.

The third electromagnetic resonance coupler 20c performs isolated transmission of the high-frequency waves generated by the high-frequency oscillation circuit 10.

The first rectifier circuit 40a generates first signals, which are control signals, by rectifying the first modulated signals transmitted by the first electromagnetic resonance coupler 20a by isolated transmission. The first rectifier circuit 40a is configured including a diode 41a, an inductor 42a, and a capacitor 43a, for example. The first signals have a waveform such as a waveform 508 in FIG. 11. The first signals are output from the first rectifier circuit 40a and are input to the gate terminal of the transistor 61, for example.

The second rectifier circuit 40b generates second signals, which are control signals, by rectifying the second modulated signals transmitted by the second electromagnetic resonance coupler 20b by isolated transmission. The second rectifier circuit 40b is configured including a diode 41b, an inductor 42b, and a capacitor 43b, for example. The second signals have a waveform such as a waveform 509 in FIG. 11, for example. The second signals are output from the second rectifier circuit 40b and are input to the gate terminal of the transistor 62, for example.

The first signals include, for example, a first off voltage and a first on voltage which is different from the first off voltage. In a case where the transistor 61 is an N-type transistor, the first on voltage is larger than the first off voltage. In a case where the transistor 61 is a P-type transistor, the first on voltage is smaller than the first off voltage. In a case where the transistor 61 is a normally-off transistor, the first off voltage of the first signals corresponds to the first amplitude of the first modulated signals, for example, and the first on voltage of the first signals corresponds to the second amplitude of the first modulated signals, for example. In this case, the first off voltage of the first signals corresponds to the first low-level voltage of the first input signals, for example, and the first on voltage of the first signals corresponds to the first high-level voltage of the first input signals, for example. In a case where the transistor 61 is a normally-on transistor, the first off voltage of the first signals corresponds to the second amplitude of the first modulated signals, for example, and the first on voltage of the first signals corresponds to the first amplitude of the first modulated signals, for example. In this case, the first off voltage of the first signals corresponds to the first high-level voltage of the first input signals, for example, and the first on voltage of the first signals corresponds to the first low-level voltage of the first input signals, for example.

The second signals include, for example, a second off voltage and a second on voltage which is different from the second off voltage. In a case where the transistor 62 is an N-type transistor, the second on voltage is larger than the second off voltage. In a case where the transistor 61 is a P-type transistor, the second on voltage is smaller than the second off voltage. In a case where the transistor 61 is a normally-off transistor, the second off voltage of the second signals corresponds to the third amplitude of the second modulated signals, for example, and the second on voltage of the second signals corresponds to the fourth amplitude of the second modulated signals, for example. In this case, the second off voltage of the second signals corresponds to the second low-level voltage of the second input signals, for example, and the second on voltage of the second signals corresponds to the second high-level voltage of the second input signals, for example. In a case where the transistor 62 is a normally-on transistor, the second off voltage of the second signals corresponds to the fourth amplitude of the second modulated signals, for example, and the second on voltage of the second signals corresponds to the third amplitude of the second modulated signals, for example. In this case, the second off voltage of the second signals corresponds to the second high-level voltage of the second input signals, for example, and the second on voltage of the second signals corresponds to the second low-level voltage of the second input signals, for example.

The second signals may exhibit the second off voltage in a period in which the first signals exhibit the first on voltage. The first signals may exhibit the first off voltage in a period in which the second signals exhibit the second on voltage. The first signals and second signals may be in a complementary relationship or may be in some other relationship. The first off voltage and the second off voltage, and/or the first on voltage and the second on voltage, may be the same value.

The following description will be made regarding a case where the transistor 61 and the transistor 62 are normally-on and N-type transistors, unless specifically stated otherwise. Specifically, an example will be described where the first on voltage and second on voltage are zero and the first off voltage and second off voltage are negative values, as illustrated in FIG. 11, for example.

The third rectifier circuit 40c generates third signals by rectifying the second high-frequency waves transmitted by the third electromagnetic resonance coupler 20c by isolated transmission. The third signals are signals of a waveform such as a waveform 507 in FIG. 11. The third rectifier circuit 40c charges the capacitor 50 with the generated third signals. The third signals have a DC voltage component.

As illustrated in FIG. 11, the third signals may be a constant voltage value. In other words, the third signals do not have to be made up of multiple voltage values. That is to say, the third signals do not have to have a signal component. It is sufficient for the third signals to have at least power to charge the capacitor. Voltage for charging the capacitor may be referred to as "charging voltage" in the present disclosure. The third signals may be made up of the charging voltage alone, as illustrated in FIG. 11 or may include the charging voltage and also another voltage smaller than the charging voltage. The charging voltage may be larger than the first on voltage of the first signals and the second on voltage of the second signals. In this case, the charge amount charged to the capacitor becomes larger. The third signals may exhibit the charging voltage in a period in which the second signals exhibit the second on voltage, and the third signals may also exhibit the charging voltage in a period in which the first signals exhibit the first on voltage, as illustrated in FIG. 11.

Now, a configuration example of a rectifier circuit 40 will be described in detail. The rectifier circuit 40 may be used as the first rectifier circuit 40a, the second rectifier circuit 40b, and the third rectifier circuit 40c. A specific example of the third rectifier circuit 40c will be described below as an example of the rectifier circuit 40. Note, however, that the specific example described below may also be similarly applied to the first rectifier circuit 40a and the second rectifier circuit 40b.

The third rectifier circuit 40c is configured including a diode 41c, an inductor 42c, and a capacitor 43c.

In the third rectifier circuit 40c, one terminal of the inductor 42c is connected to one terminal of the diode 41c, the other terminal of the inductor 42c is connected to one terminal of the capacitor 43c, and the other terminal of the diode 41c and the other terminal of the capacitor 43c are connected to an output reference terminal of the third rectifier circuit 40c, for example. The contact point of the one terminal of the inductor 42c and the one terminal of the diode 41c functions as an input terminal of the third rectifier circuit 40c, and the contact point of the other terminal of the inductor 42c and the one terminal of the capacitor 43c functions as an output terminal of the third rectifier circuit 40c.

The cathode of the diode 41c is connected to the input terminal of the third rectifier circuit 40c in the example illustrated in FIG. 11. Accordingly, the third rectifier circuit 40c rectifies the positive voltage component of the second high-frequency waves. Meanwhile, the anode of the diode 41a is connected to the input terminal of the first rectifier circuit 40a, and the anode of the diode 41b is connected to the input terminal of the second rectifier circuit 40b. Accordingly, the first rectifier circuit 40a and the second rectifier circuit 40b rectify the negative voltage component of the modulated signals. Note that whether the voltage components which the rectifier circuits rectify are positive or negative is not restricted in particular. The polarities may be set as appropriate in accordance with the properties of the output selection unit 60. For example, the polarities may be set as appropriate in accordance with whether the transistor 61 and transistor 62 making up the output selection unit 60 are normally-on or normally-off and whether N-type or P-type.

Now, the output terminal of the third rectifier circuit 40c is adjusted by the inductor 42c and capacitor 43c to be at the short-circuit point of the frequency of the high-frequency waves. Accordingly, the high-frequency waves input from the input terminal of the third rectifier circuit 40c are reflected near the output terminal of the third rectifier circuit 40c. Thus, the amplitude (voltage value) of high-frequency waves at the input terminal of the third rectifier circuit 40c is approximately twice the amplitude (voltage value) of the original high-frequency waves input from the third electromagnetic resonance coupler 20c. This configuration enables high-frequency waves to be efficiently rectified by the single diode 41c.

Note that even if the output terminal of the third rectifier circuit 40c is not precisely the short-circuit point of the frequency of the high-frequency waves, highly efficient rectification can be performed as long as the third rectifier circuit 40c operates as a low-pass filter of a predetermined frequency.

The output selection unit 60 includes the transistor 61 and the transistor 62. The transistor 61 supplies the charge which is charged to the capacitor 50 to the gate terminal of the semiconductor switching device 1 in accordance with the first signals. The transistor 62 extracts the charge at the gate terminal of the semiconductor switching device 1 in accordance with the second signals.

The transistor 61 supplies the charge which is charged to the capacitor 50 to the gate terminal of the semiconductor switching device 1 in accordance with the first signals, which are the control signals. The drain terminal of the transistor 61 is connected to one terminal of the capacitor 50, and the source terminal of the transistor 61 is connected to the output terminal 71, the drain terminal of the transistor 62, and the output reference terminal of the first rectifier circuit 40a. The gate terminal of the transistor 61 is connected to the output terminal of the first rectifier circuit 40a.

The drain terminal and source terminal of the transistor 61 conduct when the first on voltage of the first signals is input to the gate terminal, for example, thereby allowing the one terminal of the capacitor 50 and the output terminal 71 to conduct. The drain terminal and source terminal of the transistor 61 are isolated from each other when the first off voltage of the first signals is input to the gate terminal, for example, thereby isolating the one terminal of the capacitor 50 and the output terminal 71 from each other.

The transistor 62 extracts the charge at the gate terminal of the semiconductor switching device 1 in accordance with the second signals, which are the control signals. The drain terminal of the transistor 62 is connected to the output terminal 71 and the source terminal of the transistor 61, and the source terminal of the transistor 62 is connected to the output reference terminal 72, the other terminal of the capacitor 50, and the output reference terminal of the second rectifier circuit 40b. The gate terminal of the transistor 62 is connected to the output terminal of the second rectifier circuit 40b.

The drain terminal and source terminal of the transistor 62 conduct when the second on voltage of the second signals is input to the gate terminal, for example, thereby allowing the output terminal 71 and the output reference terminal 72 to conduct. The drain terminal and source terminal of the transistor 62 are isolated from each other when the second off voltage of the second signals is input to the gate terminal, for example, thereby isolating the output terminal 71 and the output reference terminal 72 from each other.

The description of the operation of the output selection unit 60 will be omitted here, since it has been described in detail in the first embodiment.

(Third Embodiment)

A third embodiment will be described below. Descriptions of elements similar to those in the above first and second embodiments will appropriately be omitted.

Figure 12:
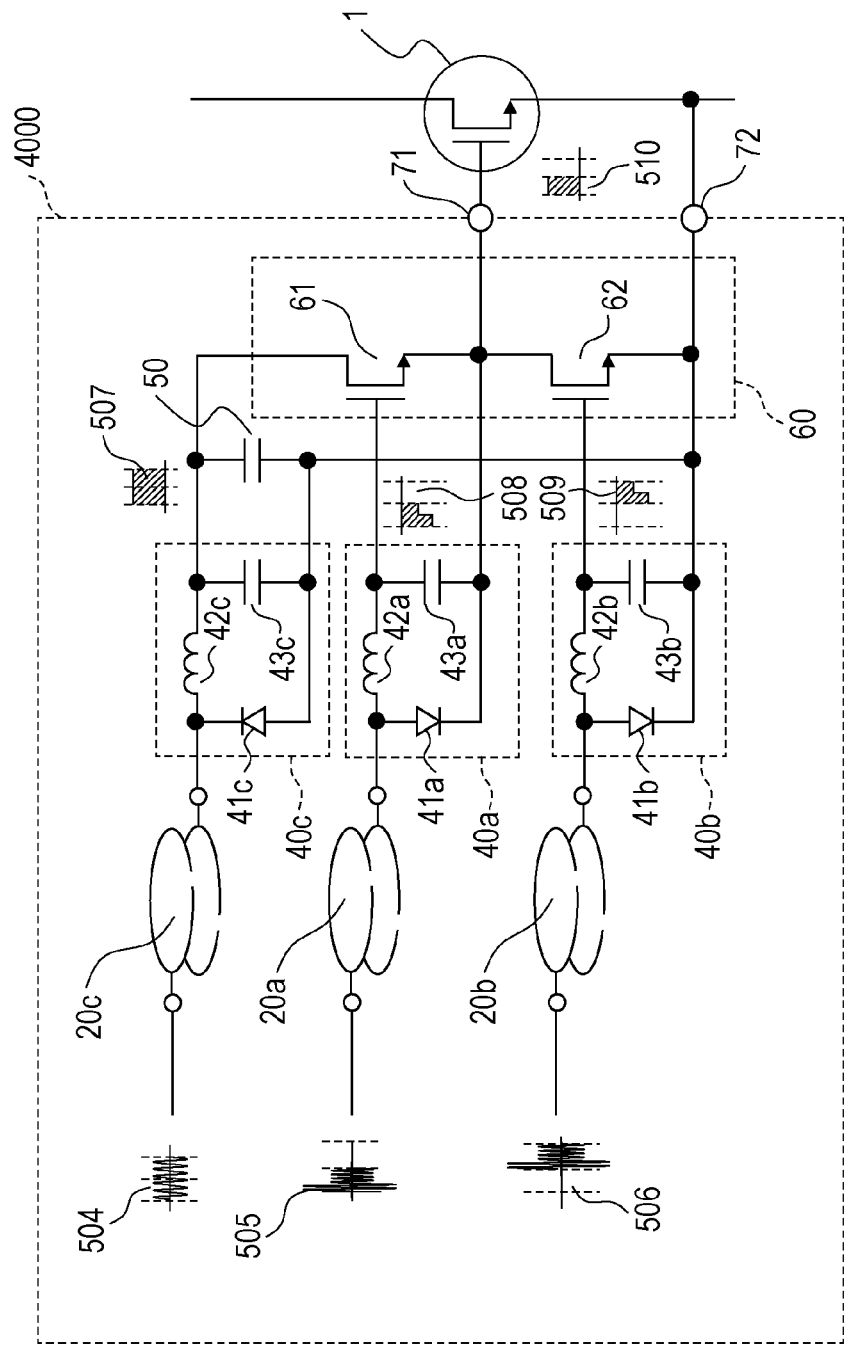
FIG. 12 is a diagram illustrating a schematic configuration of a drive device according to a third embodiment.

FIG. 12 is a diagram illustrating a schematic configuration of a drive device 4000 according to the third embodiment.

Figure 13:
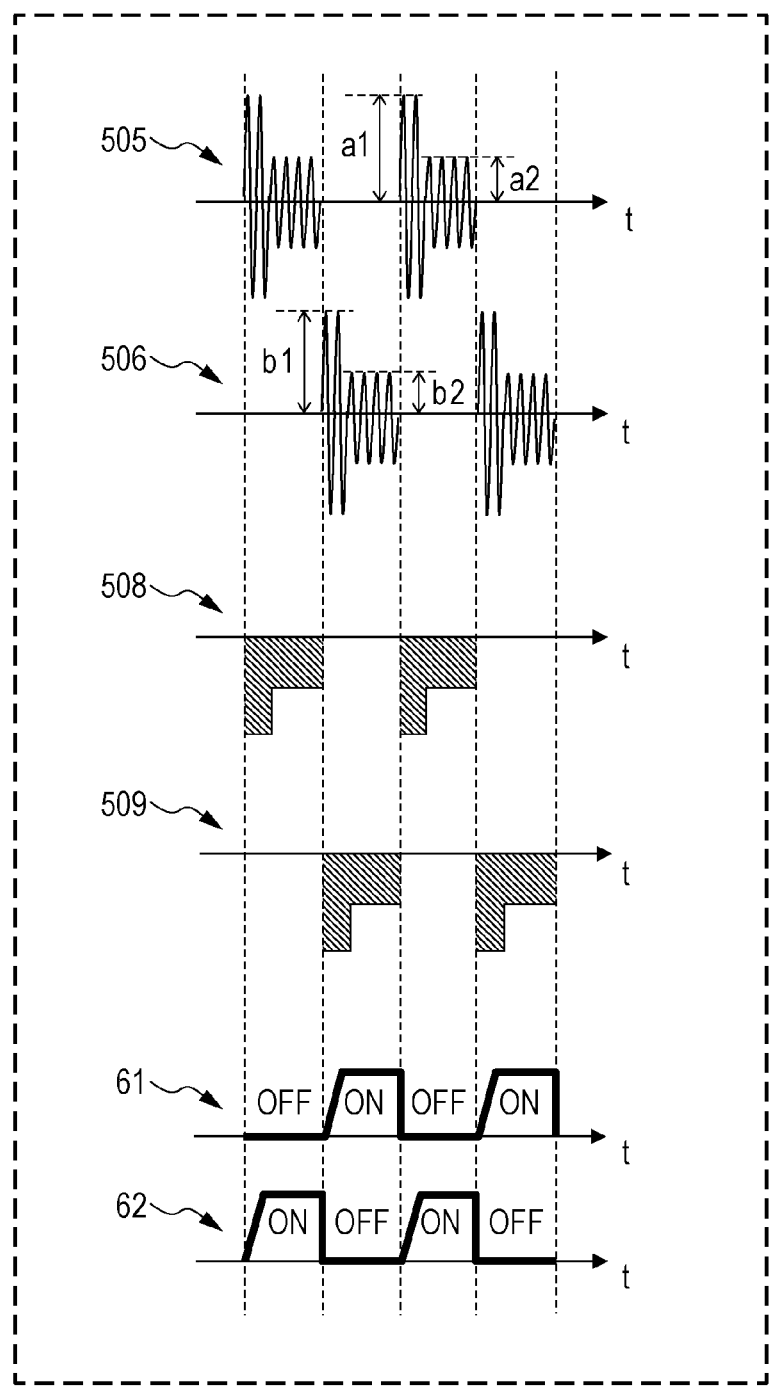
FIG. 13 is a diagram illustrating examples of signals in the third embodiment.

FIG. 13 is a diagram illustrating examples of signals in the third embodiment.

In the drive device 4000 according to the third embodiment, first modulated signals 505 have signals with an amplitude a1 and signals with an amplitude a2.

In first control signals 508, signals generated by a rectification of the signals with the amplitude a1 by the first rectifier circuit 40a switch the first switching device from the conducting state to the non-conducting state.

In the first control signals 508, signals generated by a rectification of the signals with the amplitude a2 by the first rectifier circuit 40a maintain the non-conducting state of the first switching device.

In this case, the amplitude a1 is larger than the amplitude a2.

This configuration enables the fall of the first switching device to be fast. As a result, a period in which the first switching device and the second switching device are simultaneously in the conducting state can further be suppressed. Further, because the amplitude a2 is small, power consumption can be reduced in a period in which the first switching device is in a stationary off state.

Further, in the drive device 4000 according to the third embodiment, second modulated signals 506 may have signals with an amplitude b1 and signals with an amplitude b2.

In second control signals 509, signals generated by a rectification of the signals with the amplitude b1 by the second rectifier circuit 40b switch the second switching device from the conducting state to the non-conducting state.

In the second control signals 509, signals generated by a rectification of the signals with the amplitude b2 by the second rectifier circuit 40b maintain the non-conducting state of the second switching device.

In this case, the amplitude b1 may be larger than the amplitude b2.

This configuration enables the fall of the second switching device to be fast. As a result, a period in which the first switching device and the second switching device are simultaneously in the conducting state can further be suppressed. Further, because the amplitude b2 is small, power consumption can be reduced in a period in which the second switching device is in the stationary off state.

Figure 14:
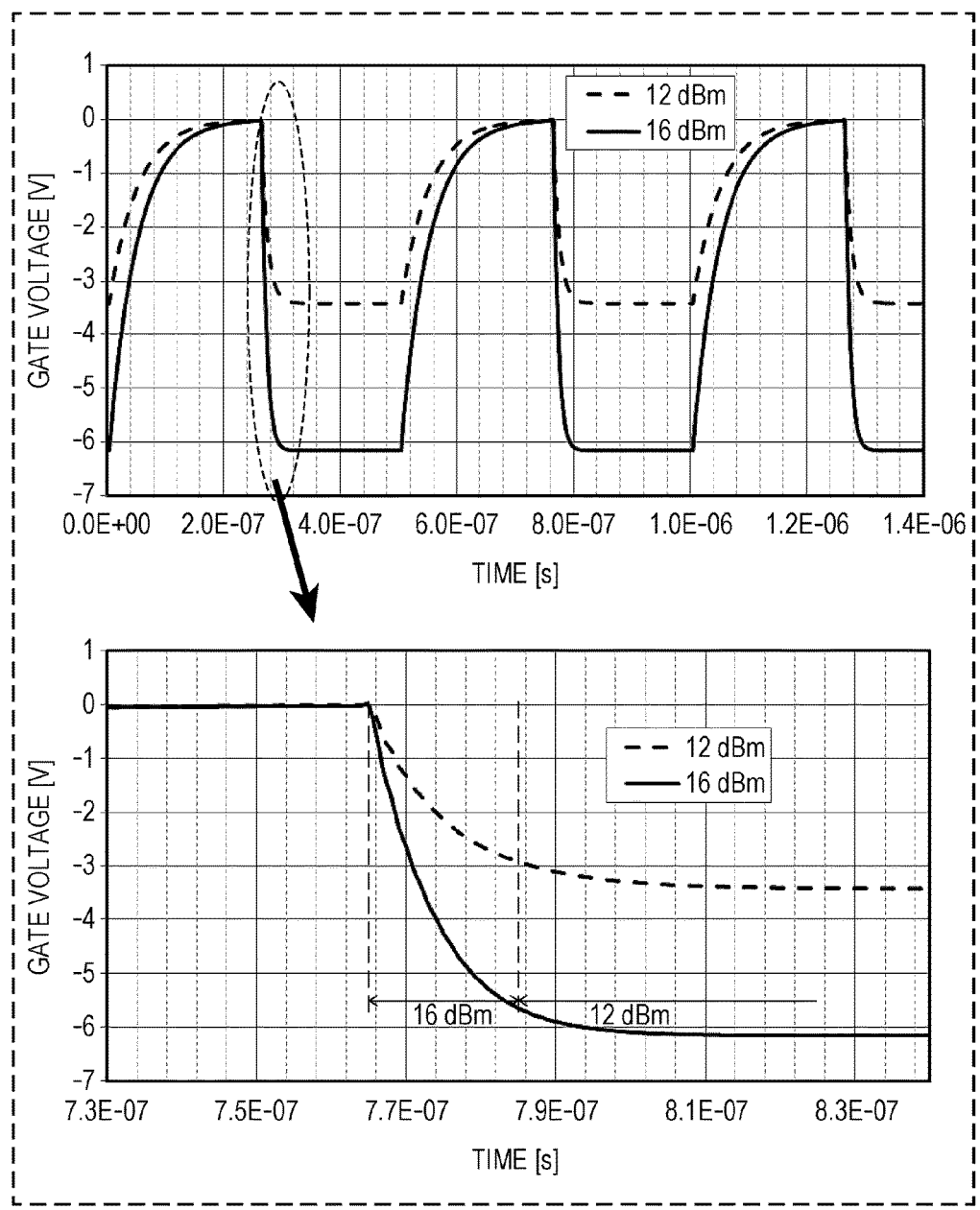
FIG. 14 is a diagram illustrating a gate voltage of the transistor.

FIG. 14 is a diagram illustrating the gate voltage of the transistor.

In FIG. 14, the solid lines represent the result in a case where input power to the transistor is set to 16 dBm. In FIG. 14, the dotted lines represent the result in a case where the input power to the transistor is set to 12 dBm.

As illustrated in FIG. 14, the falling speed of the transistor can further be made fast in a case where the input power is 16 dBm compared to a case where the input power is 12 dBm. As a result, the through-current can be reduced.

Note that the above-described first to third embodiments may appropriately be combined with each other.

In the above-described embodiments of the present invention, the "connection between two elements" (e.g., one element connects to another element) may mean, not only a direct connection, but also an electrical connection and a connection in which an element (e.g., a wiring, a resistor, and the like, which do not impair the functions of the embodiments) is inserted therebetween.

The present disclosure is useful as a gate driving circuit driving a power semiconductor device handling great electric power, for example.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A drive device that drives a semiconductor switching device, comprising:
    a capacitor; and
    an output selection unit that selects whether or not to supply charge of the capacitor to a conduction control terminal of the semiconductor switching device,
    wherein the output selection unit includes a first switching device and a second switching device, the first switching device and the second switching device having the same conductivity type,
    a first terminal of the capacitor and a first terminal of the first switching device are connected with each other,
    a second terminal of the capacitor and a terminal of the semiconductor switching device are connected with each other at a first contact point,
    a second terminal of the first switching device and the conduction control terminal of the semiconductor switching device are connected with each other at a second contact point,
    a first terminal of the second switching device and the second contact point are connected with each other,
    a second terminal of the second switching device and the first contact point are connected with each other,
    the charge of the capacitor is supplied to the conduction control terminal of the semiconductor switching device by the first switching device going to a conducting state,
    the charge is extracted from the conduction control terminal of the semiconductor switching device by the second switching device going to the conducting state, and
    a gate width of the second switching device is smaller than the gate width of the first switching device.

2. The drive device according to claim 1, wherein the first switching device and the second switching device are normally-on transistors.

3. The drive device according to claim 1, further comprising:
    a first electromagnetic resonance coupler; a second electromagnetic resonance coupler; a first rectifier circuit; and a second rectifier circuit,
    wherein a first modulated signal obtained by a modulation of a high-frequency wave in accordance with an input signal is transmitted by isolated transmission by the first electromagnetic resonance coupler and rectified by the first rectifier circuit to generate a first control signal,
    the conducting state of the first switching device is controlled by the first control signal being input to the conduction control terminal of the first switching device,
    a second modulated signal obtained by a modulation of a high-frequency wave in accordance with the input signal is transmitted by isolated transmission by the second electromagnetic resonance coupler and rectified by the second rectifier circuit to generate a second control signal, and
    the conducting state of the second switching device is controlled by the second control signal being input to the conduction control terminal of the second switching device.

4. The drive device according to claim 3,
    wherein the first modulated signal has a signal with a first amplitude and a signal with a second amplitude,
    in the first control signal, a signal generated by a rectification of the signal with the first amplitude by the first rectifier circuit switches the first switching device from the conducting state to a non-conducting state,
    in the first control signal, a signal generated by a rectification of the signal with the second amplitude by the first rectifier circuit maintains the non-conducting state of the first switching device, and
    the first amplitude is larger than the second amplitude.

5. The drive device according to claim 3,
    wherein the second modulated signal has a signal with a third amplitude and a signal with a fourth amplitude,
    in the second control signal, a signal generated by a rectification of the signal with the third amplitude by the second rectifier circuit switches the second switching device from the conducting state to a non-conducting state, in the second control signal, a signal generated by a rectification of the signal with the fourth amplitude by the second rectifier circuit maintains the non-conducting state of the second switching device, and the third amplitude is larger than the fourth amplitude.

6. The drive device according to claim 3, further comprising:

a third electromagnetic resonance coupler; and a third rectifier circuit, wherein the high-frequency wave is transmitted by isolated transmission by the third electromagnetic resonance coupler, and rectified by the third rectifier circuit to generate a charging voltage, and the capacitor is charged by the charging voltage.

7. A drive device that drives a semiconductor switching device, comprising:

a capacitor;

an output selection unit that selects whether or not to supply charge of the capacitor to a conduction control terminal of the semiconductor switching device; and a first electromagnetic resonance coupler; a second electromagnetic resonance coupler; a first rectifier circuit; and a second rectifier circuit, wherein the output selection unit includes a first switching device and a second switching device, a first terminal of the capacitor and a first terminal of the first switching device are connected with each other, a second terminal of the capacitor and a terminal of the semiconductor switching device are connected with each other at a first contact point, a second terminal of the first switching device and the conduction control terminal of the semiconductor switching device are connected with each other at a second contact point, a first terminal of the second switching device and the second contact point are connected with each other, a second terminal of the second switching device and the first contact point are connected with each other, the charge of the capacitor is supplied to the conduction control terminal of the semiconductor switching device by the first switching device going to a conducting state, the charge is extracted from the conduction control terminal of the semiconductor switching device by the second switching device going to the conducting state, a gate width of the second switching device is smaller than the gate width of the first switching device, a first modulated signal obtained by a modulation of a high-frequency wave in accordance with an input signal is transmitted by isolated transmission by the first electromagnetic resonance coupler and rectified by the first rectifier circuit to generate a first control signal, the conducting state of the first switching device is controlled by the first control signal being input to the conduction control terminal of the first switching device, a second modulated signal obtained by a modulation of a high-frequency wave in accordance with the input signal is transmitted by isolated transmission by the second electromagnetic resonance coupler and rectified by the second rectifier circuit to generate a second control signal, and the conducting state of the second switching device is controlled by the second control signal being input to the conduction control terminal of the second switching device.

8. The drive device according to claim 7, wherein the first switching device and the second switching device are normally-on transistors.

9. The drive device according to claim 7, wherein the first modulated signal has a signal with a first amplitude and a signal with a second amplitude, in the first control signal, a signal generated by a rectification of the signal with the first amplitude by the first rectifier circuit switches the first switching device from the conducting state to a non-conducting state, in the first control signal, a signal generated by a rectification of the signal with the second amplitude by the first rectifier circuit maintains the non-conducting state of the first switching device, and the first amplitude is larger than the second amplitude.

10. The drive device according to claim 7, wherein the second modulated signal has a signal with a third amplitude and a signal with a fourth amplitude, in the second control signal, a signal generated by a rectification of the signal with the third amplitude by the second rectifier circuit switches the second switching device from the conducting state to a non-conducting state, in the second control signal, a signal generated by a rectification of the signal with the fourth amplitude by the second rectifier circuit maintains the non-conducting state of the second switching device, and the third amplitude is larger than the fourth amplitude.

11. The drive device according to claim 7, further comprising:

a third electromagnetic resonance coupler; and a third rectifier circuit, wherein the high-frequency wave is transmitted by isolated transmission by the third electromagnetic resonance coupler, and rectified by the third rectifier circuit to generate a charging voltage, and the capacitor is charged by the charging voltage.

* * * * *